(12) United States Patent
Miyamoto (10) Patent No.: US 10,738,390 B2
(45) Date of Patent: Aug. 11, 2020

(54) SUBSTRATE HOLDER AND PLATING APPARATUS USING THE SAME

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 160 days.

(21) Appl. No.: 15/589,888

(22) Filed: May 8, 2017

(65) Prior Publication Data

US 2017/0321343 A1 Nov. 9, 2017

(30) Foreign Application Priority Data

May 9, 2016 (JP) .................. 2016-093993

(51) Int. Cl.
| | | |
|---|---|---|
| *C25D 17/00* | (2006.01) | |
| *C25D 17/08* | (2006.01) | |
| *C25D 7/12* | (2006.01) | |
| *C25D 17/06* | (2006.01) | |
| *H01L 21/288* | (2006.01) | |
| *H01L 21/683* | (2006.01) | |

(52) U.S. Cl.
CPC ......... *C25D 17/001* (2013.01); *C25D 17/004* (2013.01); *C25D 17/08* (2013.01); *C25D 7/12* (2013.01); *C25D 17/005* (2013.01); *C25D 17/06* (2013.01); *H01L 21/288* (2013.01); *H01L 21/683* (2013.01)

(58) Field of Classification Search
CPC .... C25D 17/06; C25D 17/005; C25D 17/001; C25D 7/12–126; C25D 17/007; H01L 21/288; H01L 21/683
See application file for complete search history.

(56) References Cited

U.S. PATENT DOCUMENTS

| | | |
|---|---|---|
| 2003/0019744 A1 | 1/2003 | Pokorny |
| 2005/0014368 A1 | 1/2005 | Yoshioka et al. |

(Continued)

FOREIGN PATENT DOCUMENTS

| | | |
|---|---|---|
| JP | 2002363797 A * | 12/2002 |
| JP | 2003-518333 A | 6/2003 |

(Continued)

OTHER PUBLICATIONS

WO2013057802A1 Machine Translation (Year: 2019).*
Machine translation of JP 2002363797 A (Year: 2020).*

*Primary Examiner* — Alexander W Keeling
(74) *Attorney, Agent, or Firm* — BakerHostetler (57) ABSTRACT

A substrate holder is provided. The substrate holder comprises a first holding member having a support surface supporting a substrate; and a second holding member sandwiching and holding the substrate together with the first holding member. The first holding member comprises a first contact point located along a periphery of the support surface. The second holding member comprises a second contact point configured to contact with the substrate placed on the support surface. The first contact point has a flat plate shape. The second contact point comprises a first end portion contacting with the substrate; and a second end portion contacting with the first contact point. The second end portion is configured to elastically contact with the first contact point when the substrate is held between the first holding member and the second holding member.

25 Claims, 8 Drawing Sheets

(56) References Cited

U.S. PATENT DOCUMENTS

| | | | |
|---|---|---|---|
| 2013/0134035 A1* | 5/2013 | Harris | C25D 17/008 204/242 |
| 2015/0090584 A1* | 4/2015 | Minami | C25D 17/06 204/198 |
| 2015/0247253 A1 | 9/2015 | Yajima et al. | |

FOREIGN PATENT DOCUMENTS

| | | | |
|---|---|---|---|
| JP | 4162440 B2 | 10/2008 | |
| WO | WO-2013057802 A1 * | 4/2013 | C25D 17/001 |

* cited by examiner

SUBSTRATE HOLDER AND PLATING APPARATUS USING THE SAME

BACKGROUND OF THE INVENTION

Field of the Invention

This application is based upon and claims benefit of priority from Japanese Patent Application No. 2016-093993 filed on May 9, 2016, the entire contents of which are incorporated herein by reference.

The present invention relates to a substrate holder and a plating apparatus using this substrate holder.

Description of the Related Art

Forming a projection-shaped connection electrode (bump), composed of gold, copper, solder, nickel, or a metal laminated with multiple layers of these, at a prescribed location (an electrode) on the surface of a semiconductor chip on which wiring is formed, has been extensively performed, for example, in Tape Automated Bonding (TAB) or the manufacture of a flip chip. A package electrode or a TAB electrode is electrically connected to a semiconductor chip, via this bump. There are various techniques, such as an electrolytic plating method, an evaporation method, a printing method, and a ball bump method, as a formation method of this bump. In recent years, an electrolytic plating method, which is capable of being miniaturized and is comparatively stable, has often been used, along with an increase in I/O number, and pitch miniaturization, of semiconductor chips.

An electrolytic plating method is roughly divided into a cup-type and a dip-type. In a cup-type, plating is performed on a substrate, by horizontally placing the surface to be plated on a substrate, such as a semiconductor wafer, facing downwards (face-down), and spouting a plating liquid from below. In a dip-type, plating is performed on a substrate, by vertically standing a substrate within a plating bath, and injecting a plating liquid from below the plating bath to cause overflow. An electrolytic plating method that adopts a dip-type has the advantages of a favorable omission of bubbles that provide an adverse influence on a plated product, and a small footprint. Accordingly, the dimensions of a plating hole will be comparatively large, and can be considered to be suitable for bump plating that requires a long time for plating.

A substrate holder, which freely attachably/detachably holds a substrate such as a semiconductor wafer, has been used in a conventional electrolytic plating apparatus that adopts a dip-type. This substrate holder causes the surface (the surface to be plated) to be exposed, by sealing the end surface and the rear surface of the substrate. Plating is performed on the surface of the substrate, by causing this substrate holder to soak within a plating liquid along with the substrate.

The substrate holder is soaked in the plating liquid during use, and thus when the substrate is held by the substrate holder, an outer peripheral portion of the substrate need to be sealed tight enough to prevent the plating liquid from running around the rear surface (surface opposite to the surface to be plated) of the substrate. For this reason, for example, assuming that the substrate holder has a pair of holding members so as to removably hold the substrate, a seal member is attached to one of the holding members and the seal member is press-contacted to a peripheral edge portion of the substrate placed on the other holding member, thereby to seal the outer peripheral portion of the substrate.

Such a substrate holder is configured to seal the outer peripheral portion of the substrate, and thus may encounter a problem in that the substrate may unexpectedly fall off from the substrate holder. The reason for this is that when the holding member having the seal member attached thereto is opened to remove the substrate from the substrate holder after plating, the holding member may be opened with the substrate attached to the seal member. In view of this, there has been known a substrate holder having a plate spring member configured to urge the substrate against the support surface when the substrate is removed from the substrate holder (refer to Japanese Patent No. 4162440). The plate spring member serves as an electrical contact point to supply current to the substrate surface.

SUMMARY OF THE INVENTION

The substrate holder disclosed in Japanese Patent No. 4162440 sandwiches and holds a substrate between a fixed holding member and a movable holding member. The movable holding member includes an electrical contact point. The fixed holding member includes a conductor along the periphery of a support surface on which the substrate is placed. The conductor is electrically connected to an external power supply. When the substrate is sandwiched between the fixed holding member and the movable holding member, the conductor contacts with the electrical contact point. The above configuration allows current to be supplied from the external power supply to the substrate surface.

The conductor (hereinafter referred to as a first contact point) of the substrate holder disclosed in Japanese Patent No. 4162440 is configured to have elasticity so as to ensure reliable contact with the electrical contact point (hereinafter referred to as a second contact point). Specifically, the first contact point has a curved plate-like body so as to apply an urging force to the second contact point. More specifically, the second contact point is formed into a plate spring so as to urge the substrate against the support surface, and the first contact point is formed into a plate spring so as to apply an urging force to the second contact point. Therefore, the conventional substrate holder requires both the first contact point and the second contact point to be made of a spring material (such as stainless steel). However, this involves a problem in that such a spring material is more expensive than a general metal material.

In view of the above problem, the present invention has been made, and one of the objects of the present invention is to provide a substrate holder including a first contact point and eliminating the need to be made of a spring material, and a plating apparatus using the same.

According to one aspect of the present invention, a substrate holder is provided. The substrate holder comprises a first holding member having a support surface supporting a substrate; and a second holding member sandwiching and holding the substrate together with the first holding member. The first holding member comprises a first contact point located along a periphery of the support surface. The second holding member comprises a second contact point configured to contact with the substrate placed on the support surface. The first contact point has a flat plate shape. The second contact point comprises a first end portion contacting with the substrate; and a second end portion contacting with the first contact point. The second end portion is configured to elastically contact with the first contact point when the substrate is held between the first holding member and the second holding member.

According to this aspect, when the substrate is held between the first holding member and the second holding member, the second contact point is configured to elastically contact with the first contact point, thus allowing the second contact point to be reliably contact with the first contact point. In addition to this, the second contact point is configured to elastically contact with the first contact point, thus allowing the first contact point to be formed into a flat plate, eliminating the need to have the first contact point made of a spring material such as stainless steel, and reducing the cost of the substrate holder.

In one aspect of the present invention, the first end portion is configured to elastically contact with the substrate when the substrate is held between the first holding member and the second holding member.

According to this aspect, the first end portion of the second contact point can reliably contact with the substrate.

In one aspect of the present invention, the second end portion is configured to contact with the first contact point on a curved surface when the substrate is held between the first holding member and the second holding member.

When the second end portion of the second connection elastically contacts with the first contact point, the reaction force from the first contact point against the elastic force of the second connection may cause a displacement of a contact portion between the second end portion and the first contact point. According to this aspect, the second end portion of the second contact point contacts with the first contact point on a curved surface, even a displacement of the contact portion between the second end portion and the first contact point can relieve the friction between the second end portion and the first contact point. Consequently, the surface of the first contact point, if plated with gold or the like for improving conductivity, can suppress the gold or the like from being peeled off from the surface of the first contact point.

In one aspect of the present invention, the second end portion elastically contacts with the first contact point so as to urge the first contact point toward the first holding member.

In one aspect of the present invention, the first contact point comprises a plurality of contact point end portions and a planar connection portion connecting the contact point end portions to each other.

In one aspect of the present invention, the substrate holder comprises an external contact point portion configured to be electrically connected to an external power supply; and a conducting wire electrically connecting between the external contact point portion and the first contact point. An outer peripheral surface of the conducting wire contacts with the planar connection portion of the first contact point.

According to this aspect, the outer peripheral surface of the conducting wire contacts with the planar connection portion of the first contact point, ensuring sufficient contact area and allowing sufficient current to be supplied to the first contact point.

In one aspect of the present invention, the first holding member comprises a fixing surface for fixing the planar connection portion; and the plurality of contact point end portions of the first contact point constitute a free end portion.

According to this aspect, even if the first contact point has a flat plate shape, the first contact point may sag when the second end portion of the second contact point contacts with the first contact point. Therefore, the first contact point can contact with the second contact point with some elasticity, ensuring more reliable contact between the first contact point and the second contact point.

In one aspect of the present invention, the second contact point comprises a plurality of the second end portions; and the plurality of second end portions are configured to contact with the plurality of contact point end portions of the first contact point respectively.

In one aspect of the present invention, the second contact point comprises a second contact point body connecting between the first end portion and the second end portion; the first end portion comprises a bent portion bent from the second contact point body, and extends toward a center side of the support surface; and when the substrate is held between the first holding member and the second holding member, the bent portion is located at substantially the same height as a surface to be plated of the substrate.

In one aspect of the present invention, the second holding member comprises a wall surface portion surrounding at least a part of a region other than the contact portion of the first contact point of the second end portion.

When the second end portion of the second contact point elastically contacts with the first contact point, the reaction force from the first contact point against the elastic force of the second connection may cause the second end portion to displace relative to the first contact point. According to this aspect, when the second end portion displaces relative to the first contact point, the second end portion contacts with the wall surface portion. Therefore, when the second end portion elastically contacts with the first contact point, the amount of displacement of the second end portion relative to the first contact point can be suppressed within a gap between the wall surface portion and the second end portion. In other words, the second end portion can be suppressed from being largely displaced relative to the first end portion.

In one aspect of the present invention, the first end portion of the second contact point is configured to contact with the substrate across a length equal to or more than 95% in a peripheral direction of the substrate.

According to this aspect, since the first end portion of the second contact point contacts with the substrate over approximately the entire periphery of the substrate, the uniformity of the current flowing to the substrate surface can be improved.

In one aspect of the present invention, a plating apparatus is provided for performing a plating process on a substrate by using the above described substrate holders.

DETAILED DESCRIPTION OF THE PREFERRED EMBODIMENTS

Figure 1:
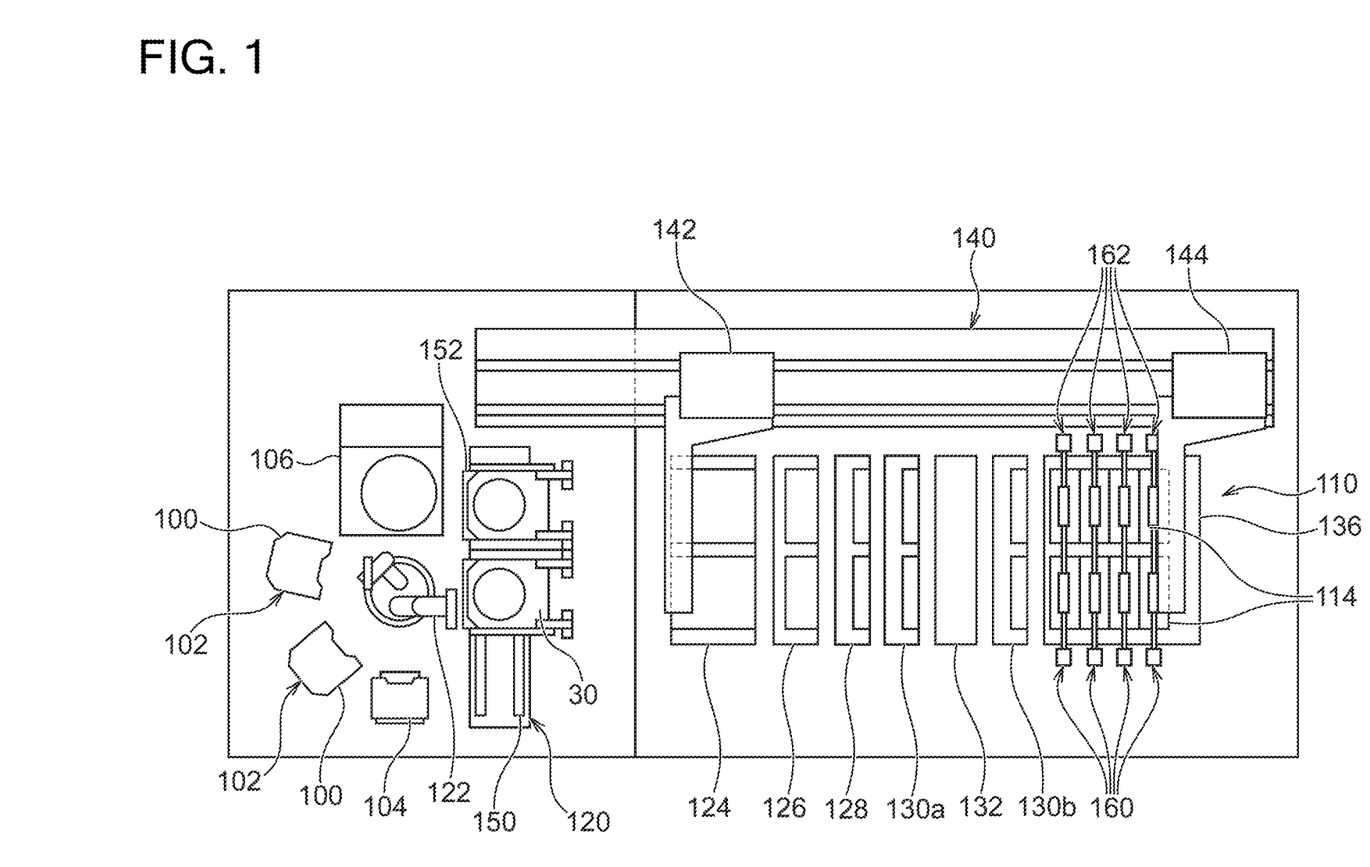
FIG. 1 is a general arrangement view of a plating apparatus for performing a plating process by using a substrate holder according to a present embodiment.

Hereinafter, embodiments of the present invention will be described by referring to the figures. In the figures described hereinafter, the same reference numerals will be attached to the same or corresponding constituent elements, and overlapping descriptions will be omitted. FIG. 1 is a general arrangement view of a plating apparatus for performing a plating process by using a substrate holder according to a present embodiment. As shown in FIG. 1, this plating apparatus has two cassette tables 102, an aligner 104 for aligning the position of an orientation flat, notch or the like of a substrate with a prescribed direction, and a spin rinse dryer 106 for drying a substrate after a plating process by high-speed rotation. The cassette table 102 is mounted with a cassette 100, on which a substrate such as a semiconductor wafer is stored. A substrate attachment/detachment section 120, which performs attachment/detachment of a substrate by placing a substrate holder 30, is provided near the spin rinse dryer 106. A substrate transportation apparatus 122, composed of a transportation robot for transporting a substrate between these units, is arranged in the center of these units 100, 104, 106, and 120.

The substrate attachment/detachment section 120 includes a flat plate-shaped placement plate 152 that freely slides in a horizontal direction along a rail 150. Two of the substrate holders 30 are placed in parallel in a horizontal state on this placement plate 152, and after delivery of a substrate between one of the substrate holders 30 and the substrate transportation apparatus 122 has been performed, the placement plate 152 slides in a horizontal direction, and delivery of a substrate between the other substrate holder 30 and the substrate transportation apparatus 122 is performed.

The plating apparatus additionally has a stocker 124, a pre-wet bath 126, a pre-soak bath 128, a first washing bath 130a, a blow bath 132, a second washing bath 130b, and a plating bath 110. In the stocker 124, storage and temporary placement of the substrate holder 30 is performed. In the pre-wet bath 126, the substrate is soaked in purified water. In the pre-soak bath 128, an oxide film of the surface of an electrically conducting layer, such as a seed layer formed on the surface of the substrate, is etched and removed. In the first washing bath 130a, the substrate after pre-soaking is washed by a washing liquid (such as purified water) together with the substrate holder 30. In the blow bath 132, liquid draining of the substrate after cleaning is performed. In the second washing bath 130b, the substrate after plating is washed by a washing liquid together with the substrate holder 30. The substrate attachment/detachment section 120, the stocker 124, the pre-wet bath 126, the pre-soak bath 128, the first washing bath 130a, the blow bath 132, the second washing bath 130b, and the plating bath 110 are arranged in this order.

This plating bath 110 is configured, for example, by storing a plurality of plating cells 114 inside an overflow bath 136. Each plating cell 114 is configured to store one substrate inside, and apply plating such as copper plating to the substrate surface by soaking the substrate within a plating liquid held inside.

The plating apparatus has a substrate holder transportation apparatus 140 adopting a linear motor system, for example, which transports the substrate holder 30 together with the substrate between each of these devices, by positioning to the side of each of these devices. This substrate holder transportation apparatus 140 has a first transporter 142, and a second transporter 144. The first transporter 142 is configured to transport the substrate between the substrate attachment/detachment section 120, the stocker 124, the pre-wet bath 126, the pre-soak bath 128, the first washing bath 130a, and the blow bath 132. The second transporter 144 is configured to transport the substrate between the first washing bath 130a, the second washing bath 130b, the blow bath 132, and the plating bath 110. The plating apparatus may not include the second transporter 144, and may include only the first transporter 142.

Paddle driving sections 160 and paddle following sections 162, which are positioned inside each of the plating cells 114 and drive paddles as mixing sticks for stirring the plating liquid within the plating cell 114, are arranged on both sides of the overflow bath 136.

An example of a series of plating processes by this plating apparatus will be described. First, one substrate is extracted by the substrate transportation apparatus 122, from the cassette 100 mounted in the cassette table 102, and the substrate is transported to the aligner 104. The aligner 104 aligns the position of an orientation flat, notch or the like with a prescribed direction. The substrate aligned in the direction by this aligner 104 is transported up to the substrate attachment/detachment section 120, by the substrate transportation apparatus 122.

In the substrate attachment/detachment section 120, two of the substrate holders 30 stored within the stocker 124 are gripped at the same time by the first transporter 142 of the substrate holder transportation apparatus 140, and are transported up to the substrate attachment/detachment section 120. Then, the two substrate holders 30 are placed horizontally at the same time on the placement plate 152 of the substrate attachment/detachment section 120. In this state, the substrate transportation apparatus 122 transports substrates to the respective substrate holders 30, and the transported substrates are held by the substrate holders 30.

Next, the two substrate holders 30 holding the substrates are gripped at the same time by the first transporter 142 of the substrate holder transportation apparatus 140, and are stored in the pre-wet bath 126. Next, the substrate holders 30 holding the substrates processed by the pre-wet bath 126 are transported to the pre-soak bath 128 by the first transporter 142, and an oxide film is etched on the substrates by the pre-soak bath 128. To continue, the substrate holders 30 holding these substrates are transported to the first washing bath 130a, and the surfaces of the substrates are washed by purified water stored in this first washing bath 130a.

The substrate holders 30 holding the substrates for which washing is completed are transported from the first washing bath 130a to the plating bath 110, by the second transporter 144, and are stored in the plating cell 114 filled with a plating liquid. The second transporter 144 sequentially stores the substrate holders 30 holding the substrates in each of the plating cells 114 of the plating bath 110, by sequentially repeating the above described procedure.

In each of the plating cells 114, plating is performed on the surface of the substrate, by applying a plating voltage between an anode (not illustrated) within the plating cell 114 and the substrate Wf, and causing the paddles to move back-and-forth in parallel with the surface of the substrate by the paddle driving section 160 and the paddle following section 162 at the same time.

After the plating is finished, the two substrate holders 30 holding the substrates after plating are gripped at the same time by the second transporter 144, transported up to the second washing bath 130b, and the surfaces of the substrates are washed with purified water by soaking in purified water stored in the second washing bath 130b. Next, the substrate holders 30 are transported to the blow bath 132 by the second transporter 144, and water drops adhered to the substrate holders 30 are removed by the spraying of air or the like. Afterwards, the substrate holders 30 are transported to the substrate attachment/detachment section 120 by the first transporter 142.

In the substrate attachment/detachment section 120, the substrate after processing is extracted from the substrate holder 30 by the substrate transportation apparatus 122, and is transported to the spin rinse dryer 106. The spin rinse dryer 106 causes the substrate after the plating process to rotate at high speed and dry by high-speed rotation. The dried substrate is returned to the cassette 100 by the substrate transportation apparatus 122.

Figure 2:
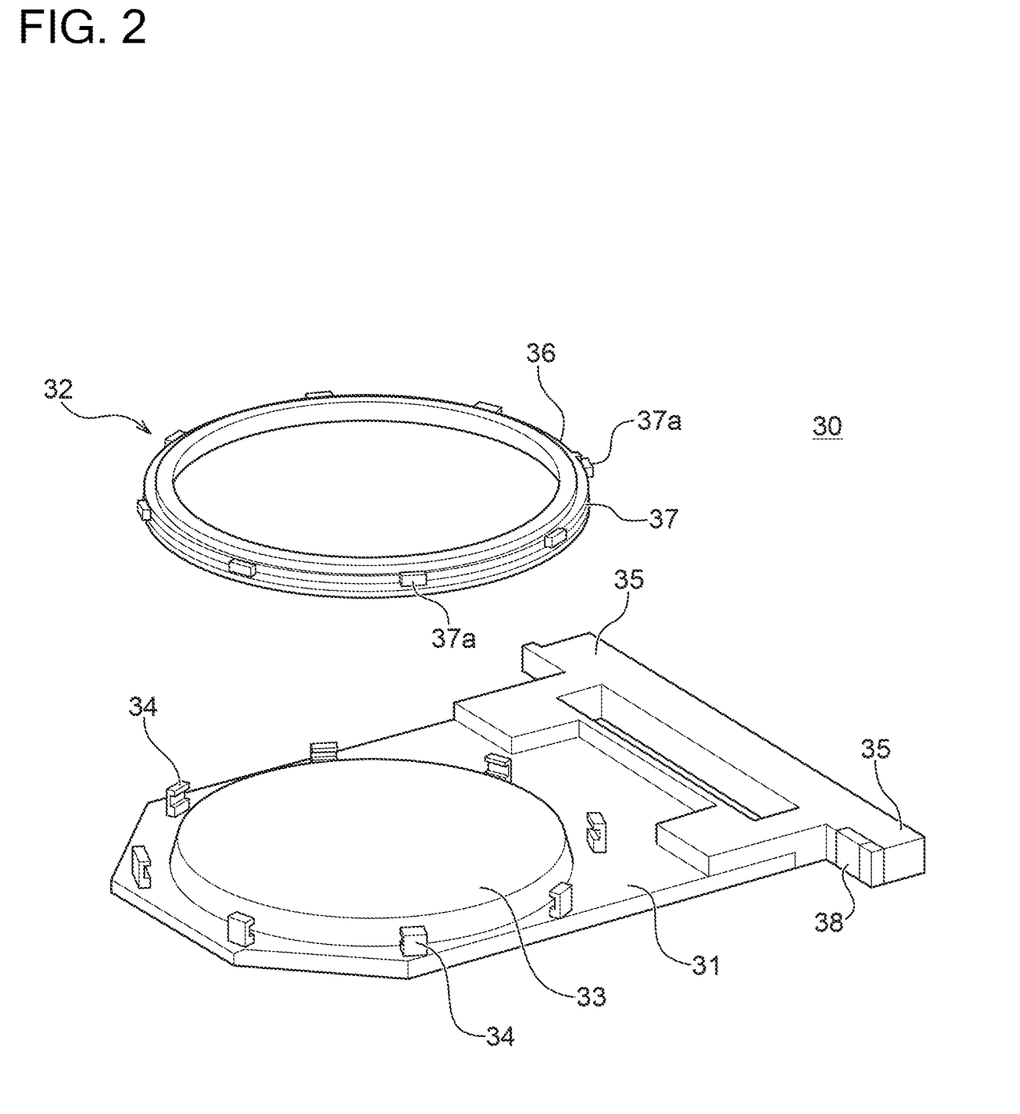
FIG. 2 is an exploded perspective view of the substrate holder according to a present embodiment.

Next, the details of the substrate holder 30 shown in FIG. 1 will be described. FIG. 2 is an exploded perspective view of the substrate holder 30 according to the present embodiment. As shown in FIG. 2, the substrate holder 30 has a rectangular flat plate-shaped first holding member 31 made, for example, by vinyl chloride, and a second holding member 32 configured to freely attach/detach with respect to this first holding member 31. This substrate holder holds a substrate such as a wafer by sandwiching the substrate by the first holding member 31 and the second holding member. A support surface 33 for supporting the substrate is provided in an approximately center portion of the first holding member 31 of the substrate holder 30. Moreover, a plurality of inverse L-shaped clampers 34, which have projection portions that project inwardly, are provided at equal intervals along the circumference of the support surface 33, on the outer side of the support surface 33 of the first holding member 31.

A pair of hands 35, which become supporting portions when transporting or suspension-supporting the substrate holder 30, are connected to the end portion of the first holding member 31 of the substrate holder 30. The substrate holder 30 is vertically suspension-supported, by hanging the hands 35 on the circumference wall upper surface of the stocker 124, within the stocker 124 shown in FIG. 1. Moreover, the substrate holder 30 is transported by gripping the hands 35 of this suspension-supported substrate holder 30 by the first transporter 142 or the second transporter 144.

Moreover, an external contact point portion 38 electrically connected to an external power supply is provided in one of the hands 35. This external contact point portion 38 is electrically connected to a plurality of first contact points 60 (refer to FIG. 3 and FIGS. 8 to 10) provided on the outer periphery of the support surface 33 via a plurality of conducting wires.

The second holding member 32 includes a ring-shaped seal holder 36. A pressor ring 37 for pressing and fixing the seal holder 36 to the first holding member 31 is freely rotatably mounted on the seal holder 36 of the second holding member 32. The pressor ring 37 has a plurality of protruding portions 37a that project outwards on this outer peripheral portion. The upper surfaces of the protruding portions 37a and the lower surfaces of the inner projection portions of the clamper 34 have tapered surfaces inclined in mutually opposite directions along a rotational direction.

At the time when holding a substrate, first, the substrate is placed on the support surface 33 of the first holding member 31 in a state where the second holding member 32 is detached from the first holding member 31, and the second holding member 32 is attached to the first holding member 31. To continue, the protruding portions 37a of the pressor ring 37 are slid to the inside (the lower side) of the inner projection portions of the clamper 34, by rotating the pressor ring 37 clockwise. As a result, the first holding member 31 and the second holding member 32 are mutually tightened and locked, and the substrate is held, via the tapered surfaces respectively provided on the pressor ring 37 and the clamper 34. At the time when releasing the holding of the substrate, the pressor ring 37 is rotated anti-clockwise, in a state where the first holding member 31 and the second holding member 32 are locked. As a result, the holding of the substrate is released, by having the protruding portions 37a of the pressor ring 37 removed from the inverse L-shaped clamper 34.

Figure 3:
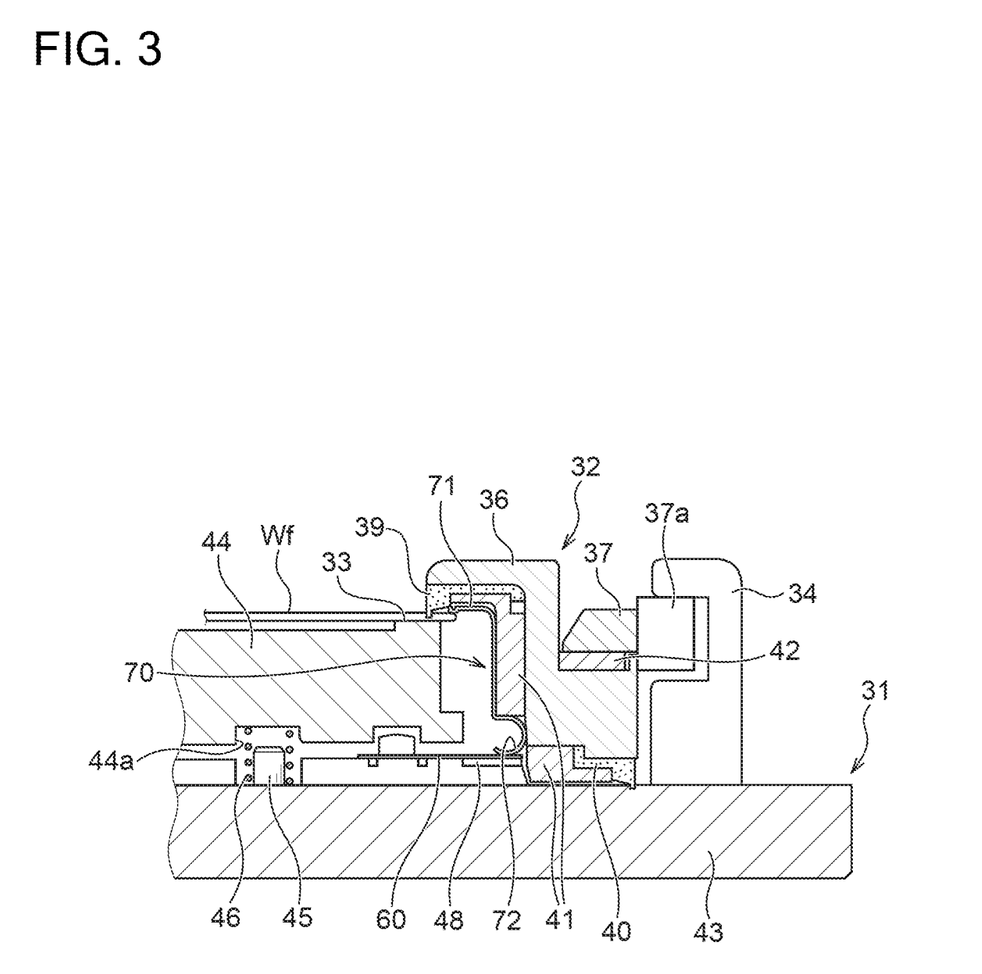
FIG. 3 is a partially expanded sectional view in a cross-section of a thickness direction of the substrate holder in a state where a substrate is held.

FIG. 3 is a partially expanded sectional view in a cross-section of a thickness direction of the substrate holder 30 in a state where a substrate is held. As illustrated, a substrate seal member 39 and a holder seal member 40 are provided on surfaces facing the first holding member 31 of the seal holder 36 of the second holding member 32. The substrate seal member 39 is configured to seal between a substrate Wf surface and the seal holder 36 by contacting with an outer peripheral part of the substrate Wf, at the time when holding the substrate Wf by the substrate holder 30. The holder seal member 40 is provided more on a radial direction outer side than the substrate seal member 39, and is configured to contact with the support base 43 of the first holding member 31. As a result of this, the holder seal member 40 can seal between the seal holder 36 and the support base 43. The substrate seal member 39 and the holder seal member 40 are attached to the seal holder 36 by sandwiching between the seal holder 36, and a fixing ring 41 attached via a fastener such as a bolt to the seal holder 36.

A step portion is provided on the outer peripheral portion of the seal holder 36 of the second holding member 32, and the pressor ring 37 is freely rotatably mounted via a spacer 42, on this step portion. The pressor ring 37 is configured from a metal having sufficient rigidity (for example, titanium), with excellent corrosion resistance with respect to acid. The spacer 42 is configured by a material with low frictional properties, for example, PTFE (polytetrafluoroethylene), so that the pressor ring 37 can rotate smoothly.

The first holding member 31 has a substantially flat plate shape and includes the support base 43 contacting with the holder seal member 40 when the substrate Wf is held by the substrate holder 30; and the substantially disk-shaped movable base 44 separated from the support base 43. The movable base 44 includes the support surface 33 shown in FIG. 2. The support surface 33 supports the outer peripheral portion of the substrate Wf, at the time when holding the substrate Wf by the substrate holder 30. The support base 43 has projections 45 and cylindrical-shaped compression springs 46, on a surface opposite the movable base 44. While one projection 45 and one compression spring 46 are shown in FIG. 3, a plurality of the projections 45 and compression springs 46 are arranged along the peripheral direction of the support surface 33. The compression springs 46 are arranged to enclose the circumference of the projection 45, and urge the movable base 44 to a direction separated from the support base 43. Concave portions 42a, in which a part of the compression springs 46 are inserted, are provided on a surface opposite the support base 43 of the movable base 44.

The movable base 44 is freely movably attached to the support base 43 in a direction approaching the support base 43, by opposing the urging force of the compression springs 46. As a result, at the time when holding the substrate Wf with a difference in thickness by the substrate holder 30, the movable base 44 moves in a direction approaching the support base 43 by opposing the urging force (spring force) of the compression springs 46, in accordance with the thickness of the substrate Wf. Therefore, even in the case where the substrate holder 30 holds the substrate Wf with a difference in thickness, the substrate seal member 39 and the holder seal member 40 can appropriately contact with the substrate Wf and the support base 43, respectively.

Specifically, at the time when holding the substrate Wf by the substrate holder 30 by locking the second holding member 32 to the first holding member 31, the substrate seal member 39 contacts with a position along the outer peripheral portion of the substrate Wf held by the substrate holder 30, and the holder seal member 40 contacts with the surface of the support base 43 of the first holding member 31. At this time, the movable base 44 moves with respect to the support base 43, in accordance with the thickness of the substrate Wf. Namely, the movement amount with respect to the support base 43 of the movable base 44 will increase as the thickness of the substrate Wf increases.

Therefore, in this substrate holder 30, the distortion (shrinkage) amount of the compression springs 46 will increase only by an amount approximately corresponding to the increment of thickness of the substrate Wf, as the thickness of the substrate Wf increases, and the movement with respect to the support base 43 of the movable base 44 will increase, by this amount. In this way, since the movement amount of the movable base 44 changes in accordance with the thickness of the substrate Wf, the substrate Wf with a difference in thickness can be held by the substrate holder 30, in a state where the compression dimensions of the substrate seal member 39 are kept within a constant range.

Figure 4:
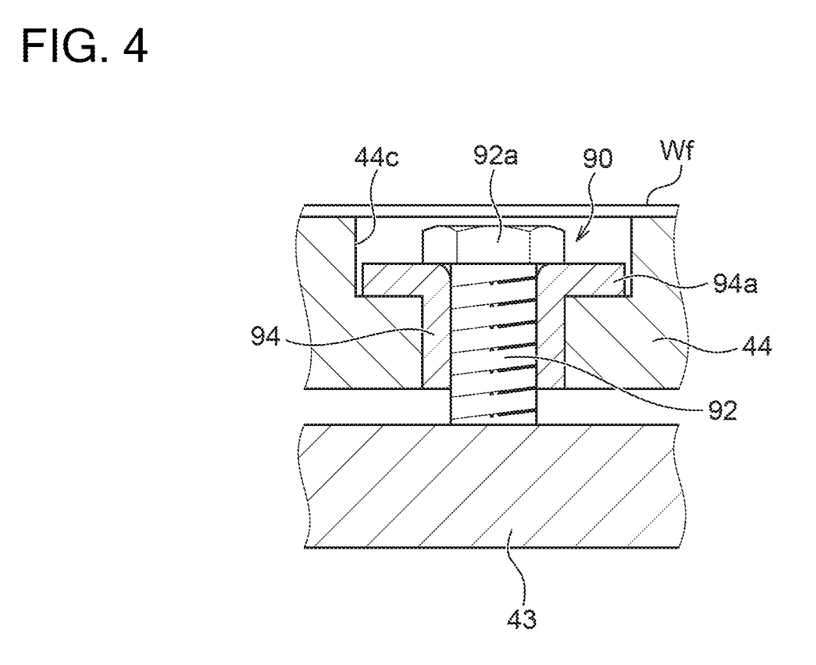
FIG. 4 is an expanded sectional view showing a base guide mechanism.

FIG. 4 is an expanded sectional view showing a base guide mechanism. The substrate holder 30 has a base guide mechanism 90, so that the movable base 44 can be moved smoothly with respect to the support base 43. The base guide mechanism 90 has a guide shaft 92 configured from a bolt or the like fixed to the support base 43, and an approximately cylindrical-shaped shaft receiver 94, fixed to the movable base 44, which has a flange 94a. The guide shaft 92 passes through the inside of the shaft receiver 94. As a result, the movable base 44 is configured to be capable of moving with respect to the support base 43 along an outer peripheral surface of the guide shaft 92. The guide shaft 92 is made of, for example, stainless steel, and the shaft receiver 94 is made of, for example, a resin with good lubricity. In order for the movable base 44 to not move in a horizontal direction with respect to the support base 43, the difference between an outer diameter of the guide shaft 92 and an inner diameter of the shaft receiver 94 can be set to between 0.05 mm and 0.16 mm.

In the illustrated example, the head portion of the bolt constituting the guide shaft 92 is used as a stopper 92a, and the flange 94a of the shaft receiver 94 is caused to abut against the stopper 92a, by the spring force of the compression springs 46. As a result, the movable base 44 is prevented from detaching from the support base 43. Moreover, in the illustrated example, a concave portion 44c is provided on the surface of the movable base 44, and the stopper 92a of the guide shaft 92 is exposed within this concave portion 44c. As a result, attachment to and detachment from the support base 43 of the movable base 44 can be easily performed, via the bolt constituting the guide shaft 92.

The description will return to FIG. 3. As shown in FIG. 3, flat plate-shaped first contact points 60 are provided on the support base 43 of the first holding member 31. While one first contact point 60 is shown in FIG. 3, a plurality of the first contact points 60 are arranged on the support base 43, along the circumference of the support surface 33. The first contact points 60 are electrically connected by conducting wires 65, which are described hereinafter (refer to FIG. 9 and FIG. 10), to the external contact point portion 38 shown in FIG. 2. The first contact points 60 are fixed to the support base 43 by arbitrary fixing devices such as screws at one end side. Moreover, a step portion 48 is formed on the support base 43, so that the other end sides of the first contact points 60 become free ends.

A plurality of second contact points 70 which feed electricity to the substrate Wf by contacting with the outer peripheral portion of the substrate Wf supported by the support surface 33, at the time when holding the substrate Wf by the substrate holder 30, are attached to the inner peripheral surface of the fixing ring 41 of the second holding member 32. While one second contact point 70 is shown in FIG. 3, a plurality of the second contact points 70 are attached across approximately the entire periphery of the fixing ring 41.

Figure 5:
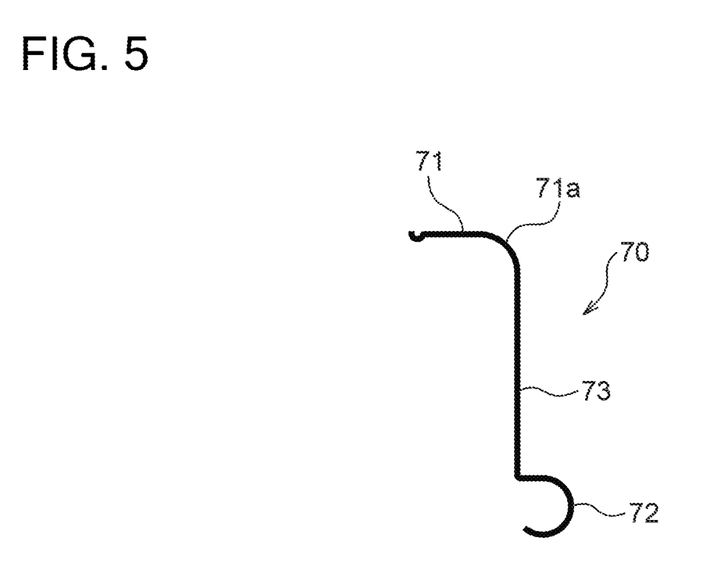
FIG. 5 is a view showing a second contact point.
Figure 6:
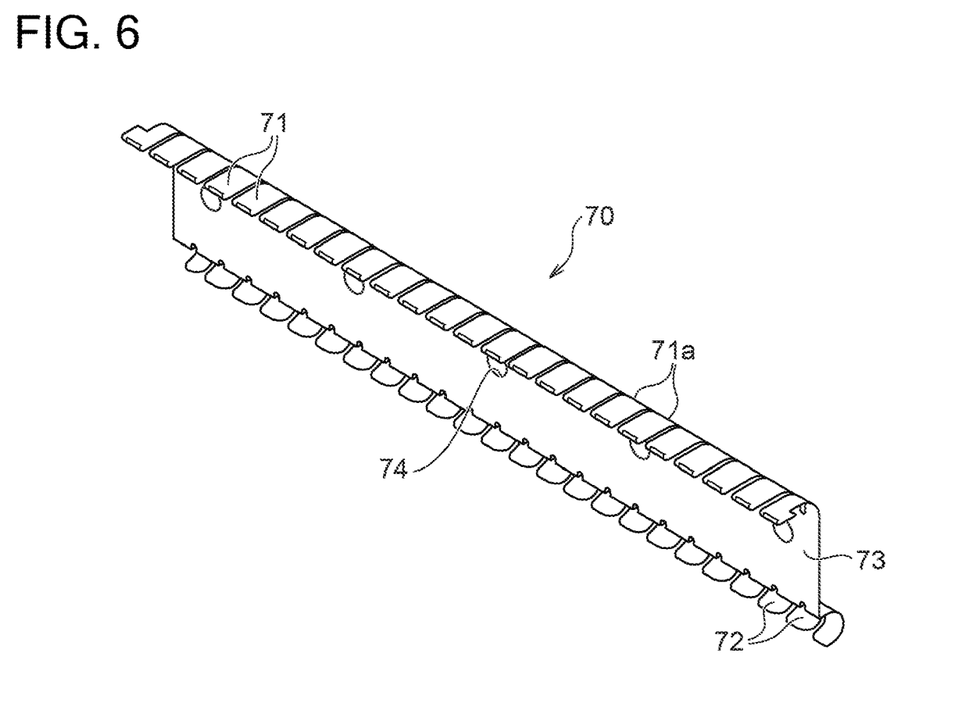
FIG. 6 is a view showing the second contact point.
Figure 7:
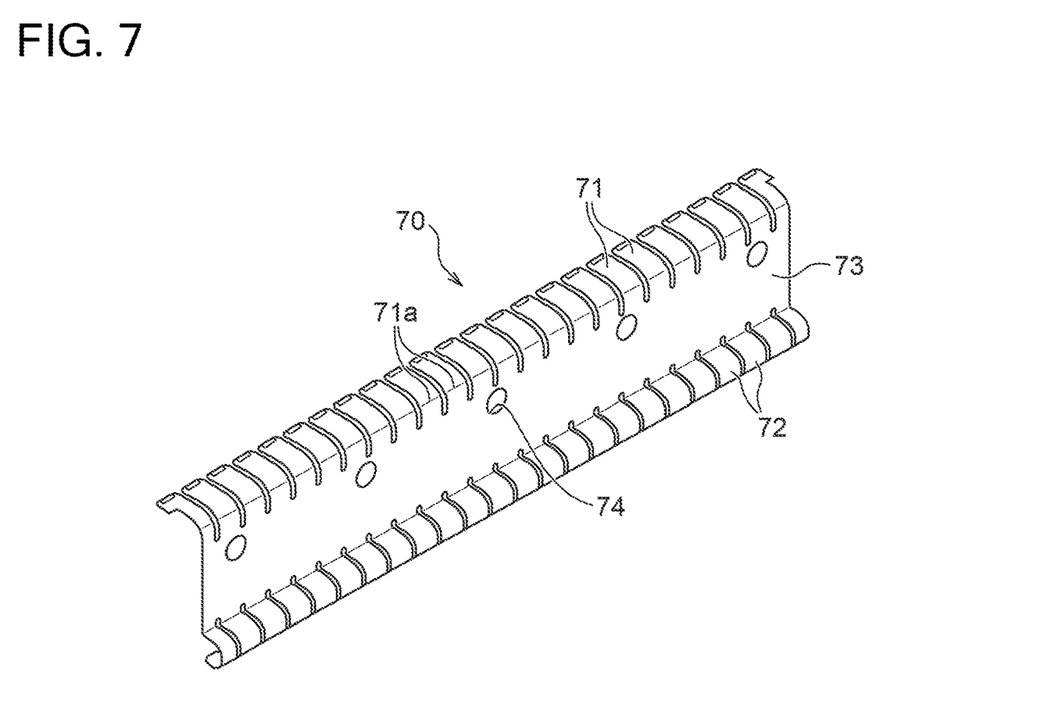
FIG. 7 is a view showing the second contact point.

FIGS. 5 to 7 show the second contact point 70 shown in FIG. 3. Specifically, FIG. 5 is a side view of the second contact point 70, FIG. 6 is a front perspective view of the second contact point 70, and FIG. 7 is a rear perspective view of the second contact point 70. As used herein, the term "front" refers to the side of the support surface 33 of the substrate holder 30, and the term "rear" refers to the side opposite to the front side. As shown in FIGS. 5 to 7, the second contact point 70 includes a plurality of first end portions 71 contacting with the substrate Wf; a plurality of second end portions 72 contacting with the first contact point 60; and a plate-shaped second contact point body 73 connecting the first end portions 71 and the second end portions 72. The second contact point 70 is preferably made of a spring material such as stainless steel.

The first end portion 71 includes a bent portion 71a bent at an angle of about 90° with respect to the second contact point body 73 and configured to protrude like a plate spring on the front side (on the center side of the support surface 33). As shown in FIG. 3, the bent portion 71a is located at substantially the same height as the surface to be plated (upper surface in FIG. 3) of the substrate Wf when the substrate Wf is held between the first holding member 31 and the second holding member 32. The first end portions 71 are configured to elastically contact with the outer peripheral portion of the substrate Wf, at the time when holding the substrate Wf by the substrate holder 30, such as shown in FIG. 3. Specifically, the first end portions 71 can contact with the outer peripheral portion of the substrate Wf while deflecting, at the time when holding the substrate Wf by the substrate holder 30. As a result, the first end portions 71 of the second contact points 70 can add a force arising from the elasticity of the first end portions 71 to the outer peripheral portion of the substrate Wf, and can surely contact with the substrate Wf. Moreover, the first end portions 71 contact with the substrate Wf across 95% or more of a peripheral direction of the substrate Wf.

As shown in FIG. 3 and FIGS. 5 to 7, the second end portions 72 of the second contact points 70 have an approximately C-shaped section in a cross-section of a thickness direction of the substrate holder 30. Specifically, the second end portions 72 form an approximately C-shaped section, by curving to the opposite side to the bending direction (front side) of the first end portions 71. As a result, the second end portions 72 of the second contact points 70 are configured to elastically contact with the first contact points 60 at the time when holding the substrate Wf by the first holding member 31 and the second holding member 32. More specifically, the second end portions 72 of the second contact points 70 elastically contact with the first contact points 60, so as to urge the first contact points 60 towards the first holding member 31, at the time when holding the substrate Wf by the first holding member 31 and the second holding member 32. As a result, the second end portions 72 of the second contact points 70 can add a force arising from the elasticity of the second end portions 72 to the first contact points 60, and can surely contact with the first contact points 60. In addition to this, since the second contact points 70 are configured to elastically contact with the first contact points 60, the first contact points 60 can be formed in a flat plate shape, such as in the present embodiment. Therefore, it is not necessary for the first contact points 60 to be formed by a spring material such as stainless steel, and the cost of the substrate holder 30 can be reduced.

Note that, while the second end portions 72 are formed so as to have an approximately C-shaped section such as shown in FIGS. 5 to 7, in the present embodiment, the shape of the second end portions 72 will not be limited to this, if the second end portions 72 can elastically contact with the first contact points 60 at the time when holding the substrate Wf by the first holding member 31 and the second holding member 32. For example, the second end portions 72 may be formed in a blade spring shape, a coil spring shape, or a plate spring shape, so that the second end portions 72 deflect at the time when contacting with the first contact points 60.

As shown in FIG. 3, in the present embodiment, the portions in contact with the first contact points 60 of the second end portions 72 are formed in a curved shape. In this way, it is preferable for the second end portions 72 to contact at a curved surface with the first contact points 60 at the time when holding the substrate Wf by the first holding member 31 and the second holding member 32. At the time when the second end portions 72 of the second contact points 70 elastically contact with the first contact points 60, there is the possibility that the contact portion between the second end portions 72 and the first contact points 60 will shift, due to a reactive force from the first contact points 60 against the elastic force. If the second end portions 72 of the second contact points 70 contact at a curved surface with the first contact points 60, such as in the present embodiment, the friction between the second end portions 72 and the first contact points 60 can be eased, even in the case where the contact portion between the second end portions 72 and the first contact points 60 is shifted. Consequently, in the case where a gold plating or the like for improving conductivity is covered on the surface of the first contact points 60, peeling of the gold plating or the like of the surface of the first contact points 60 can be suppressed.

Moreover, as shown in FIG. 3, the second end portions 72 of the second contact points 70 have an upper side and a rear side that are surrounded by the fixing ring 41 and the seal holder 36. In other words, the fixing ring 41 and the seal holder 36 of the second holding member 32 constitute a wall surface portion surrounding at least a part of a region other than the contact portion with the first contact points 60 of the second end portions 72. As described above, at the time when the second end portions 72 of the second contact points 70 elastically contact with the first contact points 60, there is the possibility that the second end portions 72 will shift with respect to the first contact points 60, due to a reactive force from the first contact points 60 against the elastic force. According to the present embodiment, at the time when the second end portions 72 shift with respect to the first contact points 60, the second end portions 72 will contact with the above described wall surface portion. Therefore, the displacement amount of the shift with respect to the first contact points 60 of the second end portions 72, at the time when the second end portions 72 elastically contact with the first contact points 60, can be suppressed within an interval of the gap between the wall surface portion and the second end portions 72. In other words, shifting of the second end portions 72 with respect to the first end portions 71 can be suppressed.

As shown in FIGS. 6 and 7, the second contact point body 73 includes a plurality of holes 74 for fixing to the fixing ring 41 with screws or the like shown in FIG. 3. Note that as shown in FIGS. 6 and 7, the second contact point 70 is not curved in the longitudinal direction before being attached to the fixing ring 41, but after being attached to the fixing ring 41, the second contact point 70 is curved along the inner peripheral surface of the fixing ring 41, that is, the first end portions 71 of the second contact point 70 are curved along the outer peripheral edge of the substrate Wf. The second contact point 70 is configured to be attached over substantially the entire circumference of the fixing ring 41 so that the first end portions 71 of the second contact point 70 contact with the substrate Wf across 95% or more in a peripheral direction of the substrate Wf. This configuration allows the first end portions 71 of the second contact point 70 to contact with the substrate Wf over substantially the entire circumference of the substrate Wf, and thus can improve the uniformity of the current flowing on the surface of the substrate Wf. Note that the second contact point 70 is consumable and thus is replaced after use for a predetermined period of time or when a trouble occurs.

Figure 8:
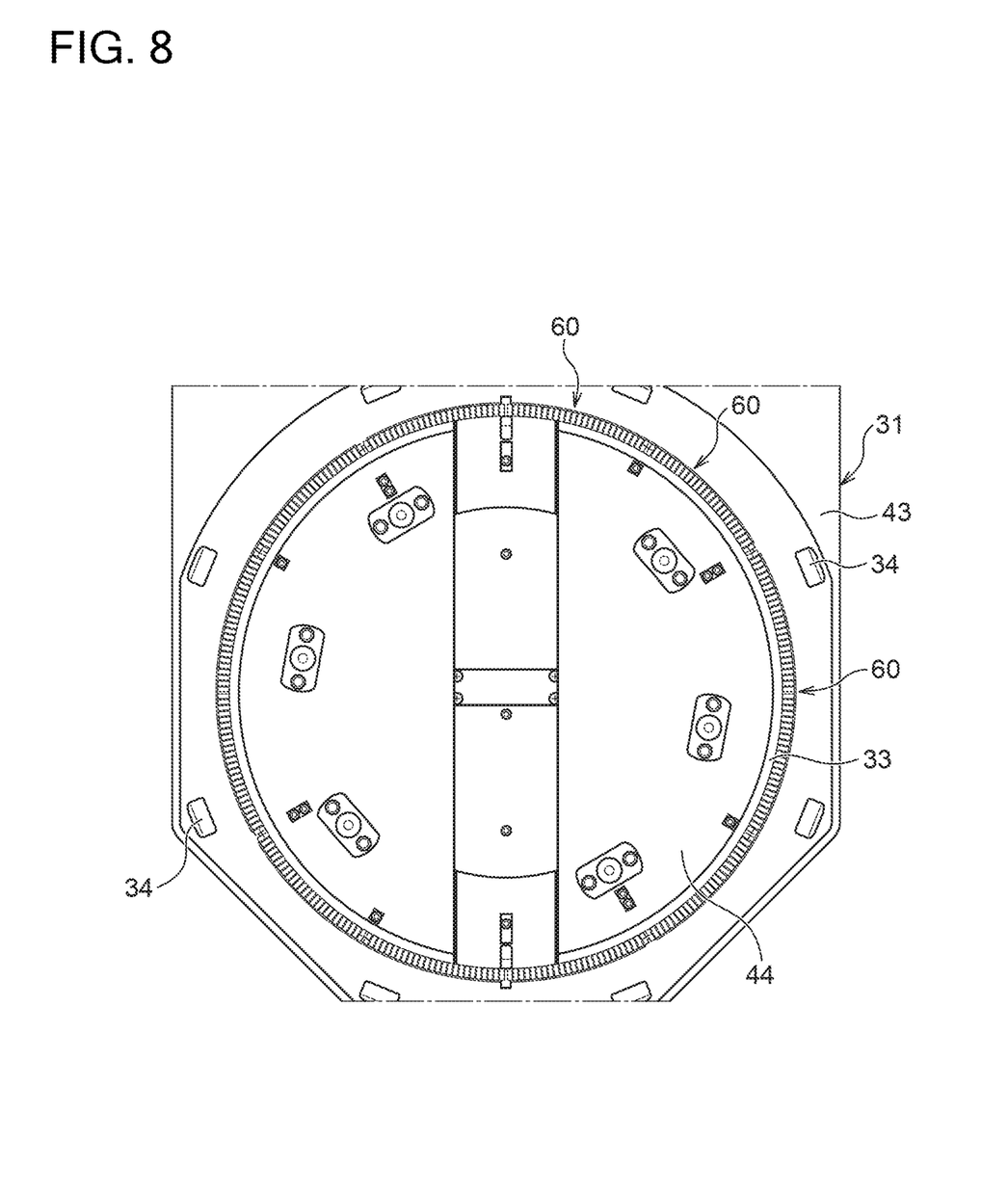
FIG. 8 is a partial plan view of a first holding member of the substrate holder.

Then, the first contact point 60 shown in FIG. 3 will be described in detail. FIG. 8 is a partial plan view of the first holding member 31 of the substrate holder 30. As shown in the Figure, the first contact point 60 is disposed on the support base 43 along the circumference of the support surface 33 over the entire circumference of the support surface 33.

Figure 9:
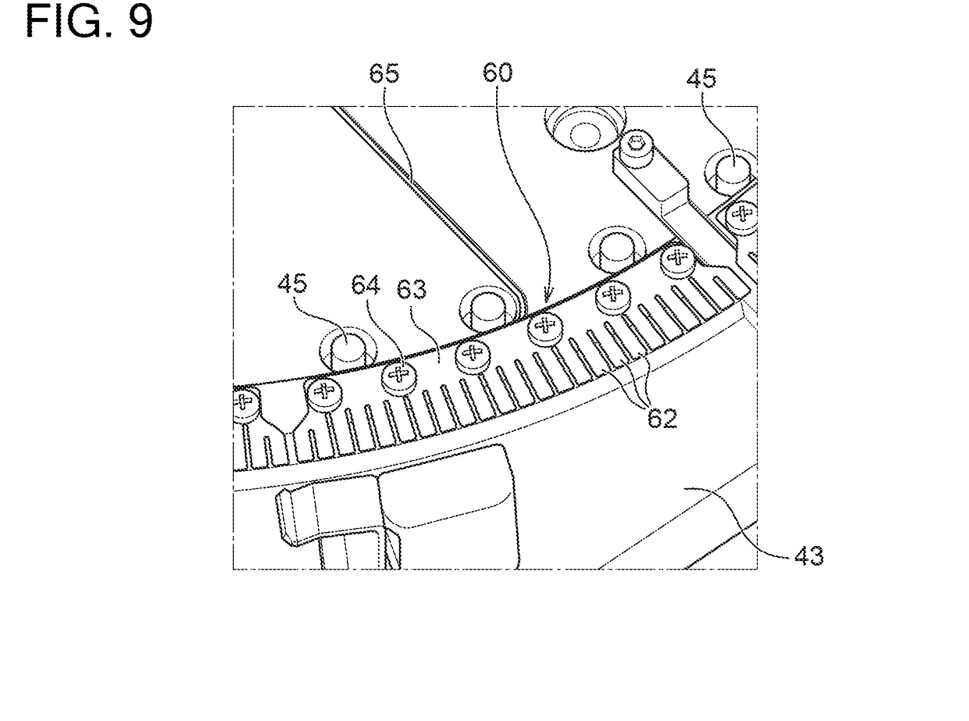
FIG. 9 is a partially enlarged view of the first contact point fixed to a support base.
Figure 10:
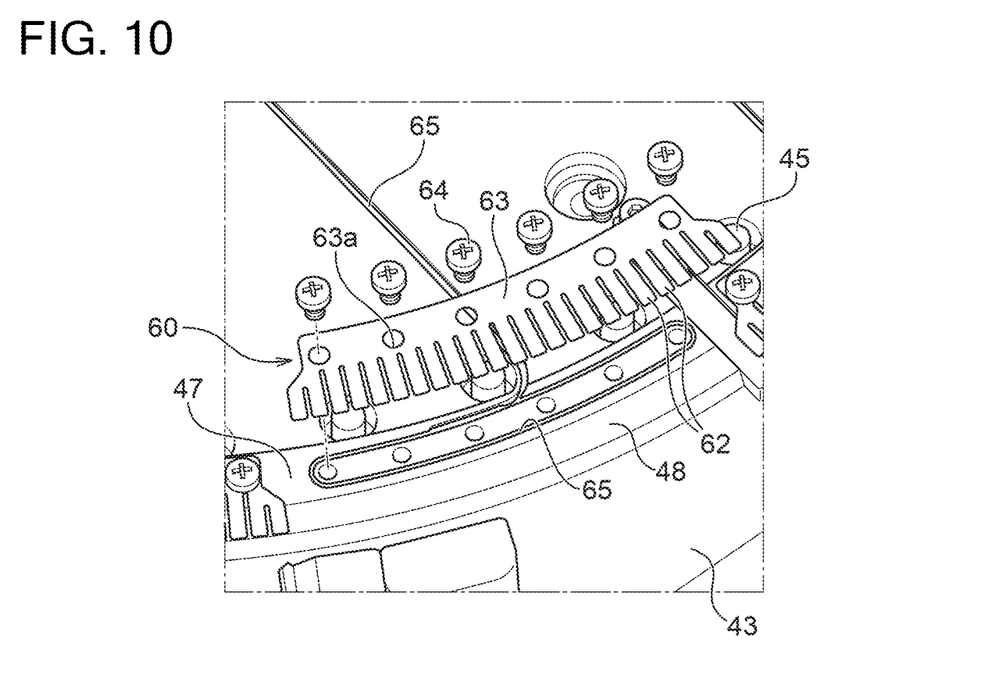
FIG. 10 is a partially enlarged view of the first contact point in a state of being removed from the support base.

FIG. 9 is a partially enlarged view of the first contact point 60 fixed to the support base 43. FIG. 10 is a partially enlarged view of the first contact point 60 in a state of being removed from the support base 43. As shown in FIGS. 9 and 10, the first contact point 60 includes a plurality of contact point end portions 62, and a planar connection portion 63 connecting the contact point end portions 62 to each other. The plurality of contact point end portions 62 of the first contact point 60 contact with the plurality of second end portions 72 of the second contact point 70 respectively as shown in FIGS. 3, and 5 to 7. As described above, the first contact point 60 has a flat plate shape as a whole, and its surface can be plated with gold or the like for improving conductivity.

In addition, the support base 43 includes a conducting wire 65 disposed so as to be embedded therein to electrically connecting the external contact point portion 38 and the first contact point 60 as shown in FIG. 2. For example, gold plating is applied to the surface of the conducting wire 65. As shown in FIG. 10, the conducting wire 65 is disposed to extend from the center of the support base 43 toward the outer circumference side along the surface of the planar connection portion 63 on the lower surface of the first contact point 60. This configuration allows the outer peripheral surface of the conducting wire 65 to contact with the planar connection portion 63 of the first contact point 60, thereby ensuring sufficient contact area and allowing sufficient current to be supplied from the external power supply to the first contact point 60.

As shown in FIG. 10, the planar connection portion 63 of the first contact point 60 includes a plurality of holes 63a for fixing to the support base 43 with screws 64. As shown in FIG. 10, the support base 43 includes a fixing surface 47 for fixing the planar connection portion 63, and a step portion 48 having a height lower than the fixing surface 47. The step portion 48 is located below the plurality of contact point end portions 62. Thus, the plurality of contact point end portions 62 of the first contact point 60 constitute a free end portion. Therefore, even if the first contact point 60 has a flat plate shape, the first contact point 60 sags when the second end portion 72 of the second contact point 70 contacts with the contact point end portions 62 of the first contact point 60. Therefore, the first contact point 60 can contact with the second contact point 70 with some elasticity, ensuring more reliable contact between the first contact point 60 and the second contact point 70.

As described above, according to the substrate holder 30 of the present embodiment, when the substrate Wf is held between the first holding member 31 and the second holding member 32, the second contact point 70 is configured to elastically contact with the first contact point 60, thereby ensuring reliable contact between the second contact point 70 and the first contact point 60. In addition to this, the second contact point 70 is configured to elastically contact with the first contact point 60, thus allowing the first contact point 60 to be formed into a flat plate, eliminating the need to have the first contact point 60 made of a spring material such as stainless steel, and reducing the cost of the substrate holder 30.

Figure 11:
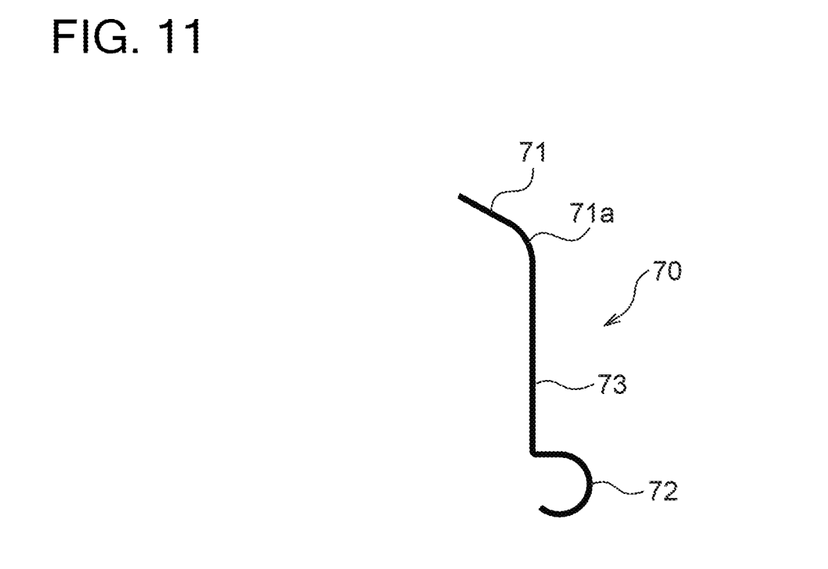
FIG. 11 is a side view showing another embodiment of the second contact point.
Figure 12:
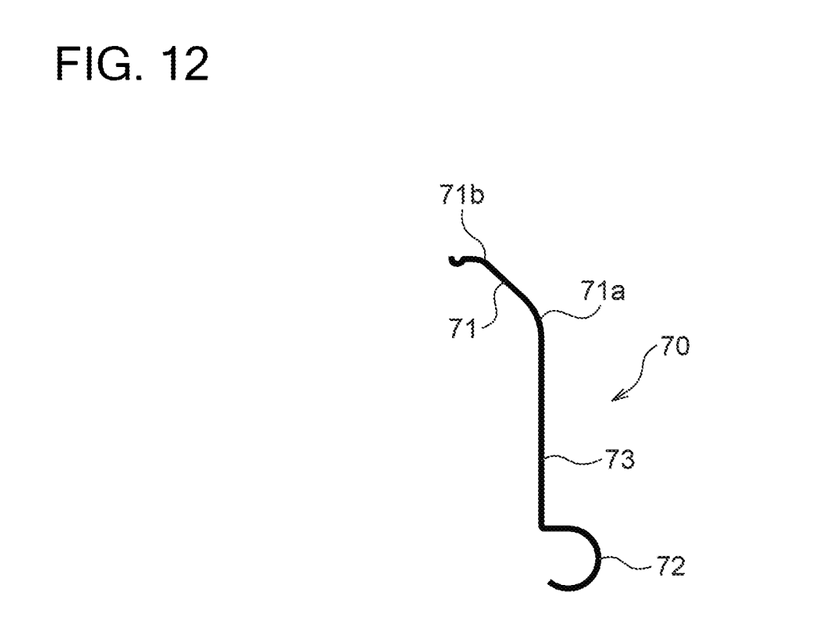
FIG. 12 is a side view showing still another embodiment of the second contact point.

FIGS. 11 and 12 are a side view showing another embodiment of the second contact point 70. The second end portion 72 and the second contact point body 73 of the second contact point 70 shown in FIG. 11 has the same shape as those of the second contact point 70 shown in FIGS. 3, and 5 to 7. However, the first end portion 71 of the second contact point 70 shown in FIG. 11 includes a bent portion 71a bent at an angle of about 60° with respect to the second contact point body 73.

The second end portion 72 and the second contact point body 73 of the second contact point 70 shown in FIG. 12 has the same shape as those of the second contact point 70 shown in FIGS. 3, and 5 to 7. However, the first end portion 71 of the second contact point 70 shown in FIG. 12 includes a bent portion 71a bent at an angle of about 60° with respect to the second contact point body 73, and further includes a bent portion 71b having a tip portion of the first end portion 71 further bent so as to have an angle of about 90° with respect to the second contact point body 73. In this manner, the second contact point 70 may take various shapes.

Heretofore, while embodiments of the present invention have been described, the above described embodiments of the present invention are for easily understanding the present invention, and do not limit the present invention. It is needless to say that the present invention can be modified or improved, without departing from the scope of the present invention, and the equivalent of this is included in the present invention. Moreover, each of the constituent elements described in the claims and specification can be arbitrarily combined or omitted, in a range that can solve at least a part of the above described problem, or in a range that accomplishes at least a part of the effect.

REFERENCE SIGNS LIST

30 . . . substrate holder
31 . . . first holding member
32 . . . second holding member
33 . . . support surface
38 . . . external contact point portion
60 . . . first contact point
62 . . . contact point end portion
63 . . . planar connection portion
65 . . . conducting wire
70 . . . second contact point
71 . . . first end portion
71a . . . bent portion
71b . . . bent portion
72 . . . second end portion
73 . . . second contact point body
Wf . . . substrate

What is claimed is:

1. A substrate holder, comprising:
a first holding member having a support surface supporting a substrate; and
a second holding member sandwiching and holding the substrate together with the first holding member, wherein the first holding member comprises a first contact point located along a periphery of the support surface; and
the second holding member comprises a second contact point configured to contact with the substrate placed on the support surface, wherein the first contact point has a planar section;
the second contact point comprises a plate-shaped second contact point body, a first end portion contacting with the substrate; and an elastic second end portion contacting with the first contact point, wherein the plate-shaped second contact point body, the first end portion, and the second end portion are integrally formed each other, the plate-shaped second contact point body is fixed to the second holding member in a state where the plate-shaped second contact point body extends in a direction perpendicular to a surface of the substrate when the substrate is held between the first holding member and the second holding member,
the first end portion of the second contact point is a plate spring having a first bent portion bent toward a center of the substrate relative to the plate-shaped second contact point body, the second end portion of the second contact point is a plate spring having a second bent portion bent toward opposite to the center of the substrate relative to the plate-shaped second contact point body and curved toward the center of the substrate relative to the plate-shaped second contact body, the elastic second end portion is configured to flex upon contact with the planar section of the first contact point when the substrate is held between the first holding member and the second holding member, and
the first end portion of the second contact point is configured to flex upon contact with the outer peripheral portion of the substrate.

2. The substrate holder according to claim 1, wherein the first end portion is configured to elastically contact with the substrate when the substrate is held between the first holding member and the second holding member.

3. The substrate holder according to claim 1, wherein the second end portion is configured to contact with the first contact point on a curved surface when the substrate is held between the first holding member and the second holding member.

4. The substrate holder according to claim 1, wherein the second end portion elastically contacts with the first contact point so as to urge the first contact point toward the first holding member.

5. The substrate holder according to claim 1, wherein the first contact point comprises a plurality of contact point end portions and a planar connection portion connecting the contact point end portions to each other.

6. The substrate holder according to claim 5, further comprising:
an external contact point portion configured to be electrically connected to an external power supply; and
a conducting wire electrically connecting between the external contact point portion and the first contact point, wherein
an outer peripheral surface of the conducting wire contacts with the planar connection portion of the first contact point.

7. The substrate holder according to claim 5, wherein the first holding member comprises a fixing surface for fixing the planar connection portion; and
the plurality of contact point end portions of the first contact point constitute a free end portion.

8. The substrate holder according to claim 5, wherein the second contact point comprises a plurality of the second end portions; and
the plurality of second end portions are configured to contact with the plurality of contact point end portions of the first contact point respectively.

9. The substrate holder according to claim 1, wherein the first end portion comprises a bent portion bent from the second contact point body, and extends toward a center side of the support surface; and
when the substrate is held between the first holding member and the second holding member, the bent portion is located at substantially the same height as a surface to be plated of the substrate.

10. The substrate holder according to claim 1, wherein the second holding member comprises a wall surface portion surrounding at least a part of a region other than the contact portion of the first contact point of the second end portion.

11. The substrate holder according to claim 1 wherein the first end portion of the second contact point is configured to contact with the substrate across 95% or more of the outer edge of the substrate.

12. A plating apparatus for plating a substrate using the substrate holder according to claim 1.

13. The substrate holder of claim 1, wherein the elastic second end portion is configured to directly contact with the planar section of the first contact point when the substrate is held between the first holding member and the second holding member.

14. A substrate holder, comprising:
a first holding member having a support surface supporting a substrate; and
a second holding member sandwiching and holding the substrate together with the first holding member, wherein the first holding member comprises a first contact point located along a periphery of the support surface; and
the second holding member comprises a second contact point configured to contact with the substrate placed on the support surface, wherein the first contact point has a planar section;
the second contact point comprises a plate-shaped second contact point body, a first end portion contacting with the substrate; and an elastic second end portion contacting with the first contact point, wherein the plate-shaped second contact point body, the first end portion, and the second end portion are integrally formed each other, the plate-shaped second contact point body is fixed to the second holding member in a state where the plate shaped second contact point body extends in a direction perpendicular to a surface of the substrate when the substrate is held between the first holding member and the second holding member, the first end portion of the second contact point is a plate spring having a first bent portion bend toward a center of the substrate relative to the plate-shaped second contact point body, the second end portion of the second contact point is a plate spring having a second bent portion bend toward opposite to the center of the substrate relative to the plate-shaped second contact point body and curved toward the center of the substrate relative to the plate-shaped second contact body, the elastic second end portion is configured to directly contact with the planar section of the first contact point when the substrate is held between the first holding member and the second holding member, and
the first end portion of the second contact point is configured to directly contact with the outer peripheral portion of the substrate.

15. The substrate holder according to claim 14, wherein the first end portion is configured to elastically contact with the substrate when the substrate is held between the first holding member and the second holding member.

16. The substrate holder according to claim 14, wherein the second end portion is configured to contact with the first contact point on a curved surface when the substrate is held between the first holding member and the second holding member.

17. The substrate holder according to claim 14, wherein the second end portion elastically contacts with the first contact point so as to urge the first contact point toward the first holding member.

18. The substrate holder according to claim 14, wherein the first contact point comprises a plurality of contact point end portions and a planar connection portion connecting the contact point end portions to each other.

19. The substrate holder according to claim 18, further comprising:
an external contact point portion configured to be electrically connected to an external power supply; and
a conducting wire electrically connecting between the external contact point portion and the first contact point, wherein
an outer peripheral surface of the conducting wire contacts with the planar connection portion of the first contact point.

20. The substrate holder according to claim 18, wherein the first holding member comprises a fixing surface for fixing the planar connection portion; and
the plurality of contact point end portions of the first contact point constitute a free end portion.

21. The substrate holder according to claim 18, wherein
the second contact point comprises a plurality of the second end portions; and
the plurality of second end portions are configured to contact with the plurality of contact point end portions of the first contact point respectively.

22. The substrate holder according to claim 14, wherein
the first end portion comprises a bent portion bent from the second contact point body, and extends toward a center side of the support surface; and
when the substrate is held between the first holding member and the second holding member, the bent portion is located at substantially the same height as a surface to be plated of the substrate.

23. The substrate holder according to claim 14, wherein
the second holding member comprises a wall surface portion surrounding at least a part of a region other than the contact portion of the first contact point of the second end portion.

24. The substrate holder according to claim 14 wherein
the first end portion of the second contact point is configured to contact with the substrate across 95% or more of the outer edge of the substrate.

25. A plating apparatus for plating a substrate using the substrate holder according to claim 14.

* * * * *